(12) United States Patent
Imaizumi

(10) Patent No.: US 10,297,994 B2
(45) Date of Patent: May 21, 2019

(54) SUBSTRATE HOLDING STRUCTURE, ELECTRONIC COMPONENT MODULE, AND ELECTRICAL CONNECTION BOX

(71) Applicant: Yazaki Corporation, Tokyo (JP)

(72) Inventor: Yoshihito Imaizumi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/360,656

(22) Filed: Nov. 23, 2016

(65) Prior Publication Data

US 2017/0163013 A1 Jun. 8, 2017

(30) Foreign Application Priority Data

Dec. 2, 2015 (JP) .................................. 2015-235468

(51) Int. Cl.
| | |
|---|---|
| *H02G 3/08* | (2006.01) |
| *H01R 12/58* | (2011.01) |
| *H01R 12/72* | (2011.01) |
| *H05K 5/00* | (2006.01) |
| *H05K 7/14* | (2006.01) |

(52) U.S. Cl.
CPC .............. *H02G 3/08* (2013.01); *H01R 12/58* (2013.01); *H01R 12/724* (2013.01); *H05K 5/006* (2013.01); *H05K 5/0039* (2013.01); *H05K 5/0069* (2013.01); *H05K 7/1402* (2013.01); *H05K 7/1427* (2013.01)

(58) Field of Classification Search
CPC ........ H02G 3/08; H01R 12/58; H01R 12/724; H05K 5/0039; H05K 5/006
USPC ........................................................ 361/752
See application file for complete search history.

(56) References Cited

U.S. PATENT DOCUMENTS

| | | | | |
|---|---|---|---|---|
| 4,779,744 A | * | 10/1988 | Shely ................... | H05K 7/1418 211/41.17 |
| 2016/0095233 A1 | * | 3/2016 | Kusumi ............... | H05K 7/1405 361/756 |

FOREIGN PATENT DOCUMENTS

| | | |
|---|---|---|
| JP | 8-145018 A | 6/1996 |
| JP | 11-135966 A | 5/1999 |
| JP | 2007-73321 A | 3/2007 |
| JP | 2008-177229 A | 7/2008 |
| JP | 2012-235577 A | 11/2012 |

OTHER PUBLICATIONS

Japanese Office Action for the related Japanese Patent Application No. 2015-235468 dated Sep. 12, 2017.
Japanese Office Action for the related Japanese Patent Application No. 2015-235468 dated Nov. 21, 2017.

* cited by examiner

*Primary Examiner* — Tremesha S Willis
(74) *Attorney, Agent, or Firm* — Kenealy Vaidya LLP

(57) ABSTRACT

A substrate holding structure includes holding units and protrusions. The holding units are provided to a casing that includes an accommodating unit accommodating therein an inserted substrate, and hold an end part of the substrate accommodated in the accommodating unit on the insertion direction-entrance side of the substrate. The protrusions protrude from side wall surfaces that are wall surfaces of the casing along the insertion direction of the substrate, the wall surfaces being opposed to the side surfaces of the substrate, and are plastically deformed due to contact with the substrate to be inserted into the accommodating unit.

12 Claims, 7 Drawing Sheets

SUBSTRATE HOLDING STRUCTURE, ELECTRONIC COMPONENT MODULE, AND ELECTRICAL CONNECTION BOX

CROSS-REFERENCE TO RELATED APPLICATION(S)

The present application claims priority to and incorporates by reference the entire contents of Japanese Patent Application No. 2015-235468 filed in Japan on Dec. 2, 2015.

BACKGROUND OF THE INVENTION

1. Field of the Invention

The present invention relates to a substrate holding structure, an electronic component module, and an electrical connection box.

2. Description of the Related Art

Conventionally, there has been a technique of fixing a substrate in a case. For example, Japanese Patent Application Laid-open No. 08-145018 discloses a technique of structure for fixing a planar article in a case where left and right side edges of the planar article are fitted and inserted between left and right inner side surfaces of the case so as to fix and house the planar article in the case. In the structure for fixing a planar article in a case according to Japanese Patent Application Laid-open No. 08-145018, at least one of the side edges of a planar article and the inner side surfaces of a case is provided with protrusions that function to sandwich and press the side edges of the planar article together with spreading deformation of the side surfaces of the case.

There is a further room for improvement in reducing rattling of a substrate. For example, even when a side edge of a substrate is sandwiched and pressed in a part of an insertion direction, rattling may occur in other parts.

SUMMARY OF THE INVENTION

An object of the present invention is to provide a substrate holding structure, an electronic component module, and an electrical connection box capable of reducing rattling of a substrate.

According to one aspect of the present invention, a substrate holding structure includes a holding unit that is provided to a casing including an accommodating unit that accommodates therein an inserted substrate, and holds an end part of the substrate accommodated in the accommodating unit on an insertion direction-entrance side of the substrate; and protrusions that protrude from side wall surfaces that are wall surfaces of the casing along an insertion direction of the substrate and opposed to side surfaces of the substrate, and that are plastically deformed due to contact with the substrate to be inserted into the accommodating unit.

According to another aspect of the present invention, in a substrate holding structure, it is preferable that the protrusions are provided to both of the pair of side wall surfaces that are opposed to each other and sandwiching the substrate.

According to still another aspect of the present invention, in a substrate holding structure, it is preferable that the protrusions are disposed in a deep part on the side wall surfaces in the insertion direction of the substrate.

According to still another aspect of the present invention, in a substrate holding structure, it is preferable to further include that a holding member that is connected to an end part of the substrate on the insertion direction-entrance side of the substrate, and is held by the holding unit, wherein the holding member includes holding-member-side protrusions that come into contact with an inner wall surface of the casing in a state where the holding member is held by the holding unit.

According to still another aspect of the present invention, an electronic component module includes a substrate to which an electronic component is connected; a casing that includes an accommodating unit accommodating therein the substrate that is inserted; a holding unit that is provided to the casing, and holds an end part of the substrate accommodated in the accommodating unit on an insertion direction-entrance side of the substrate; and protrusions that protrude from side wall surfaces that are wall surfaces of the casing along an insertion direction of the substrate and opposed to side surfaces of the substrate, and that are plastically deformed due to contact with the substrate to be inserted into the accommodating unit.

According to still another aspect of the present invention, an electrical connection box includes a substrate to which an electronic component is connected; a casing that includes an accommodating unit accommodating therein the substrate that is inserted; a holding unit that is provided to the casing, and holds an end part of the substrate accommodated in the accommodating unit on an insertion direction-entrance side of the substrate; protrusions that protrude from side wall surfaces that are wall surfaces of the casing along an insertion direction of the substrate and opposed to side surfaces of the substrate, and that are plastically deformed due to contact with the substrate to be inserted into the accommodating unit; and a frame that holds therein the casing.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

A substrate holding structure, an electronic component module, and an electrical connection box according to an embodiment of the present invention will now be described with reference to the accompanying drawings. It should be noted that the embodiment below is not intended to limit the invention. Components in the embodiment include components that can be easily thought of by the skilled person or substantially like components.

Embodiment

Figure 1:
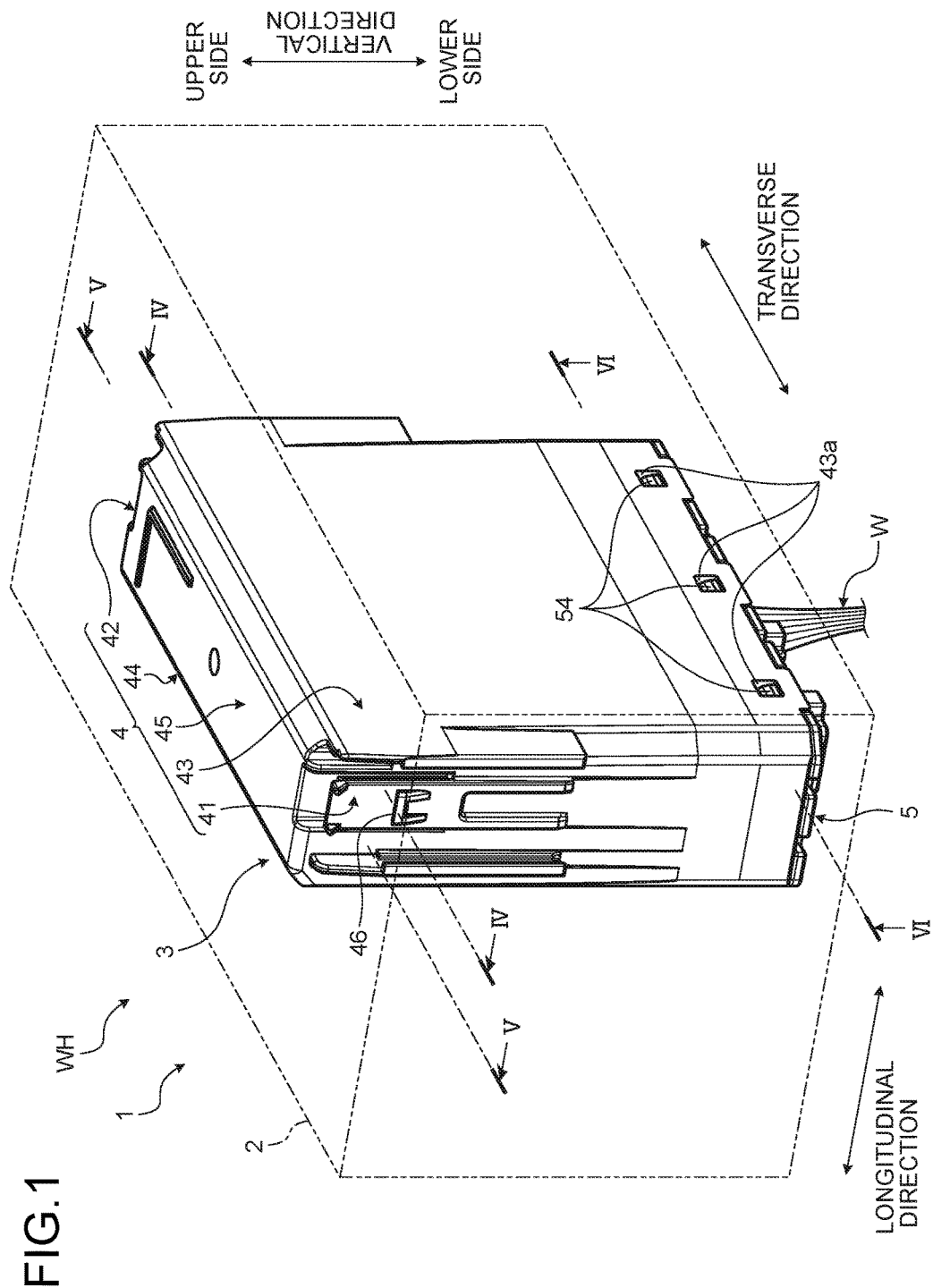
FIG. 1 is a perspective view illustrating an electrical connection box in accordance with an embodiment.
Figure 2:
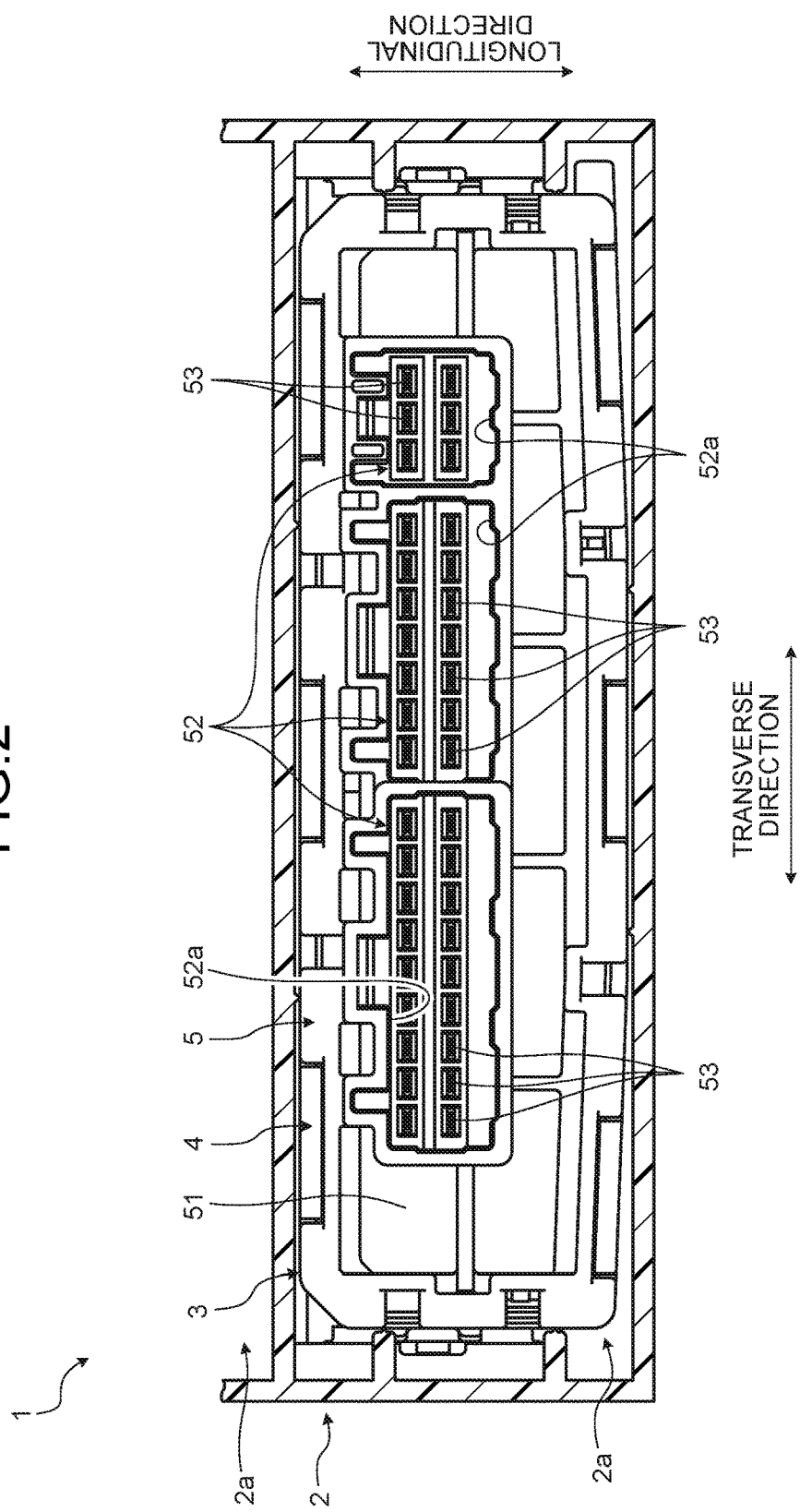
FIG. 2 is a bottom view illustrating the electrical connection box in accordance with the embodiment.
Figure 3:
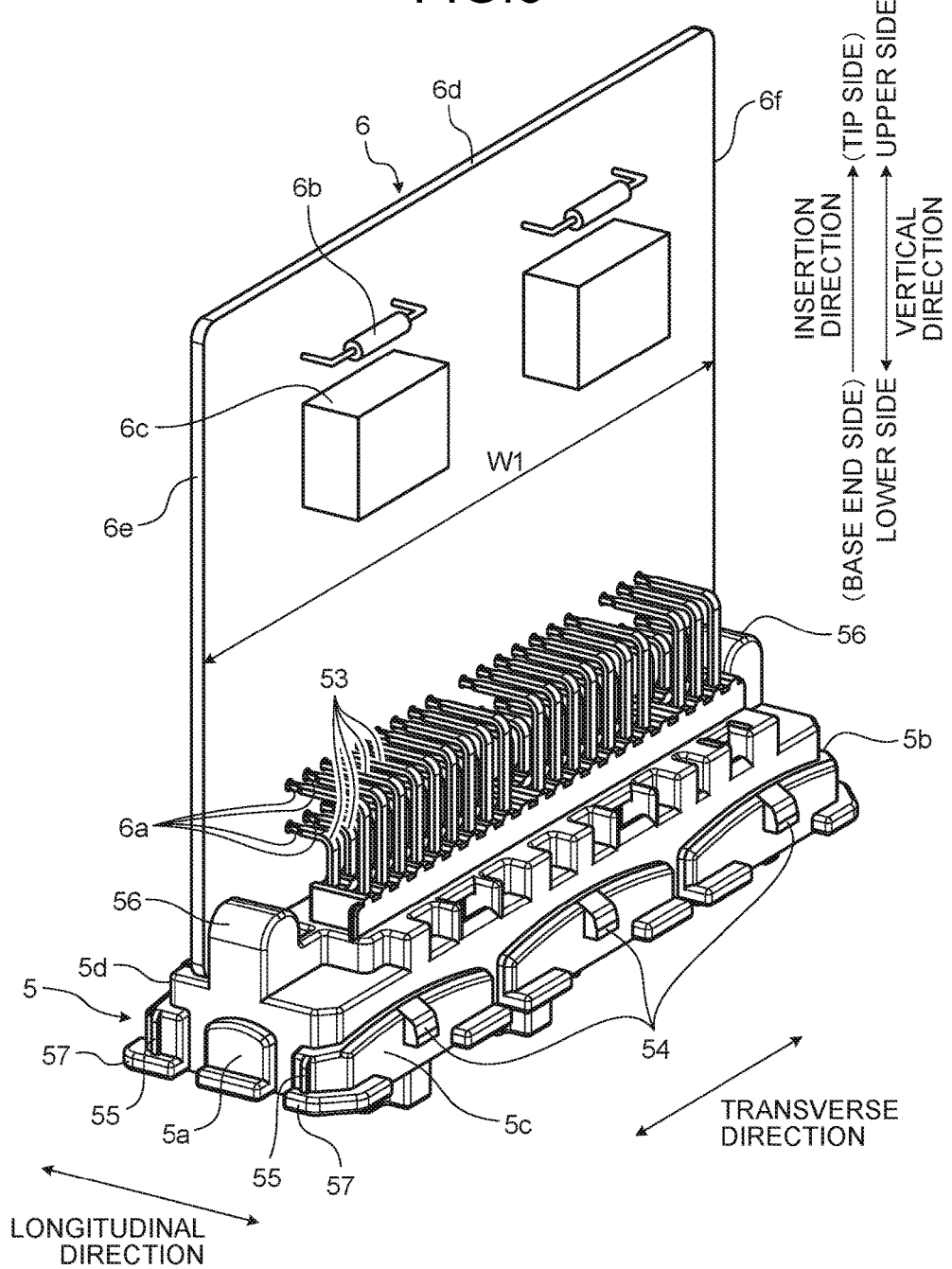
FIG. 3 is a perspective view illustrating a substrate and a connector block in accordance with the embodiment.
Figure 4:
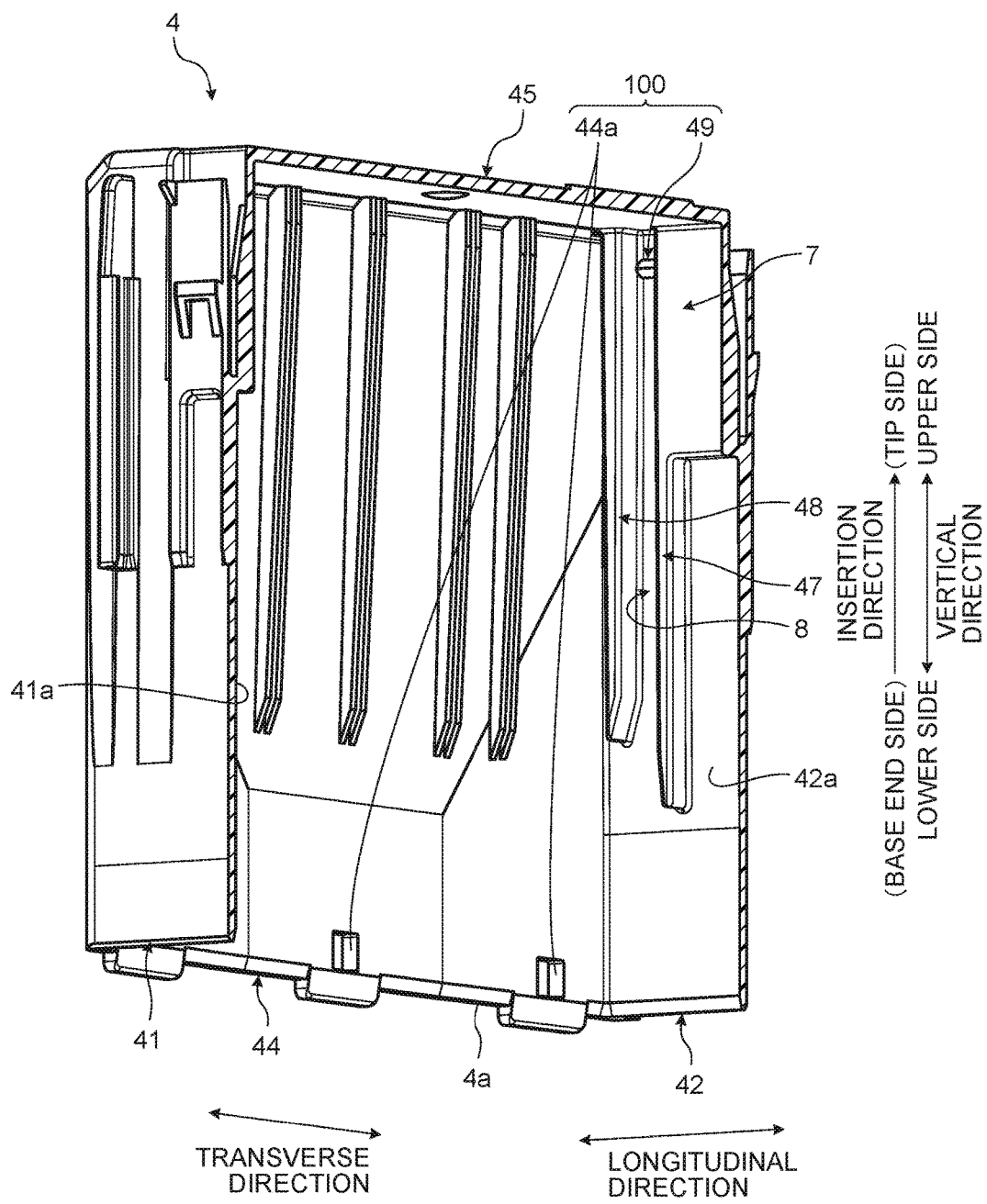
FIG. 4 is a cross-sectional perspective view illustrating a casing in accordance with the embodiment.
Figure 5:
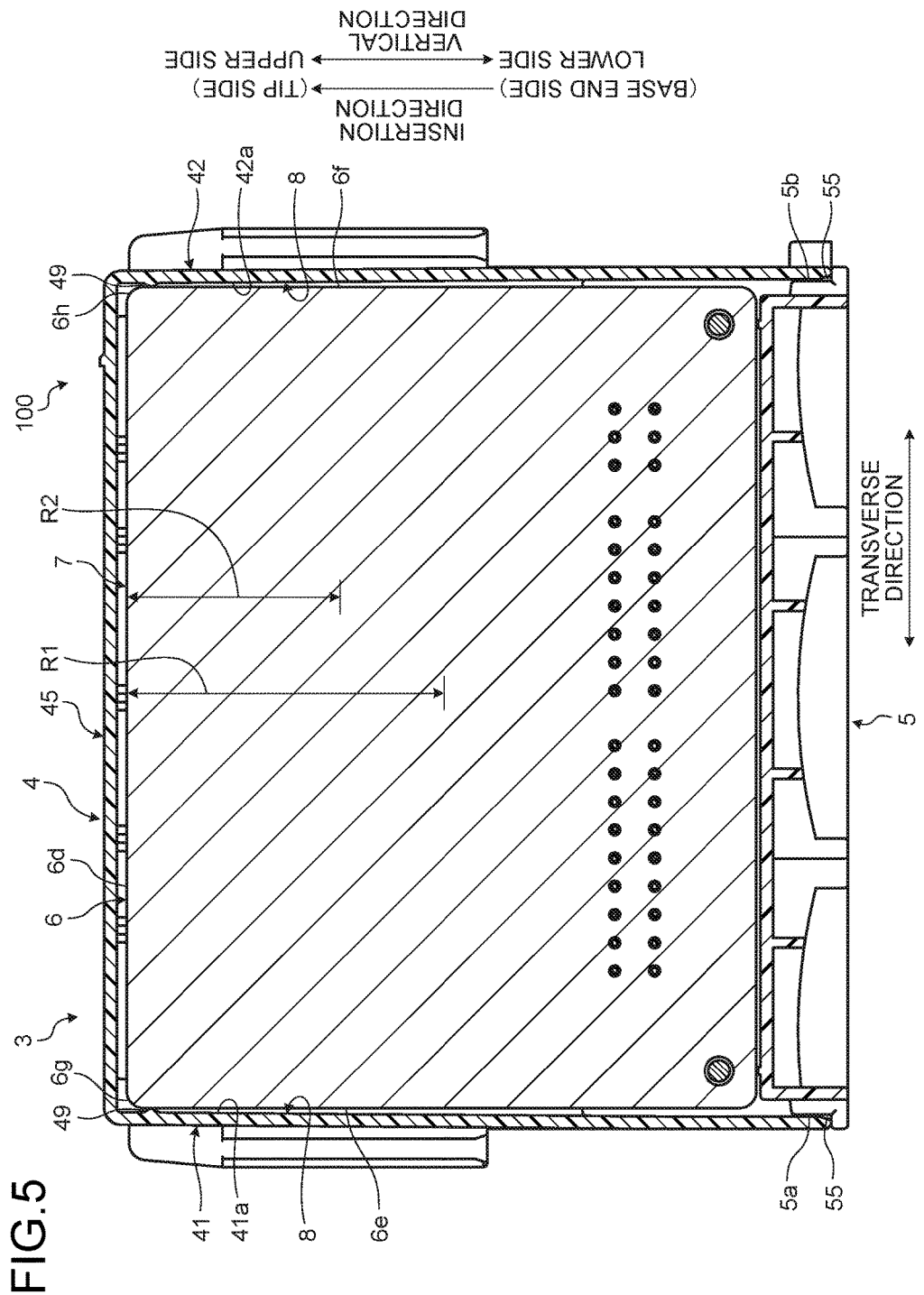
FIG. 5 is a cross-sectional view illustrating an electronic component module in accordance with the embodiment.
Figure 6:
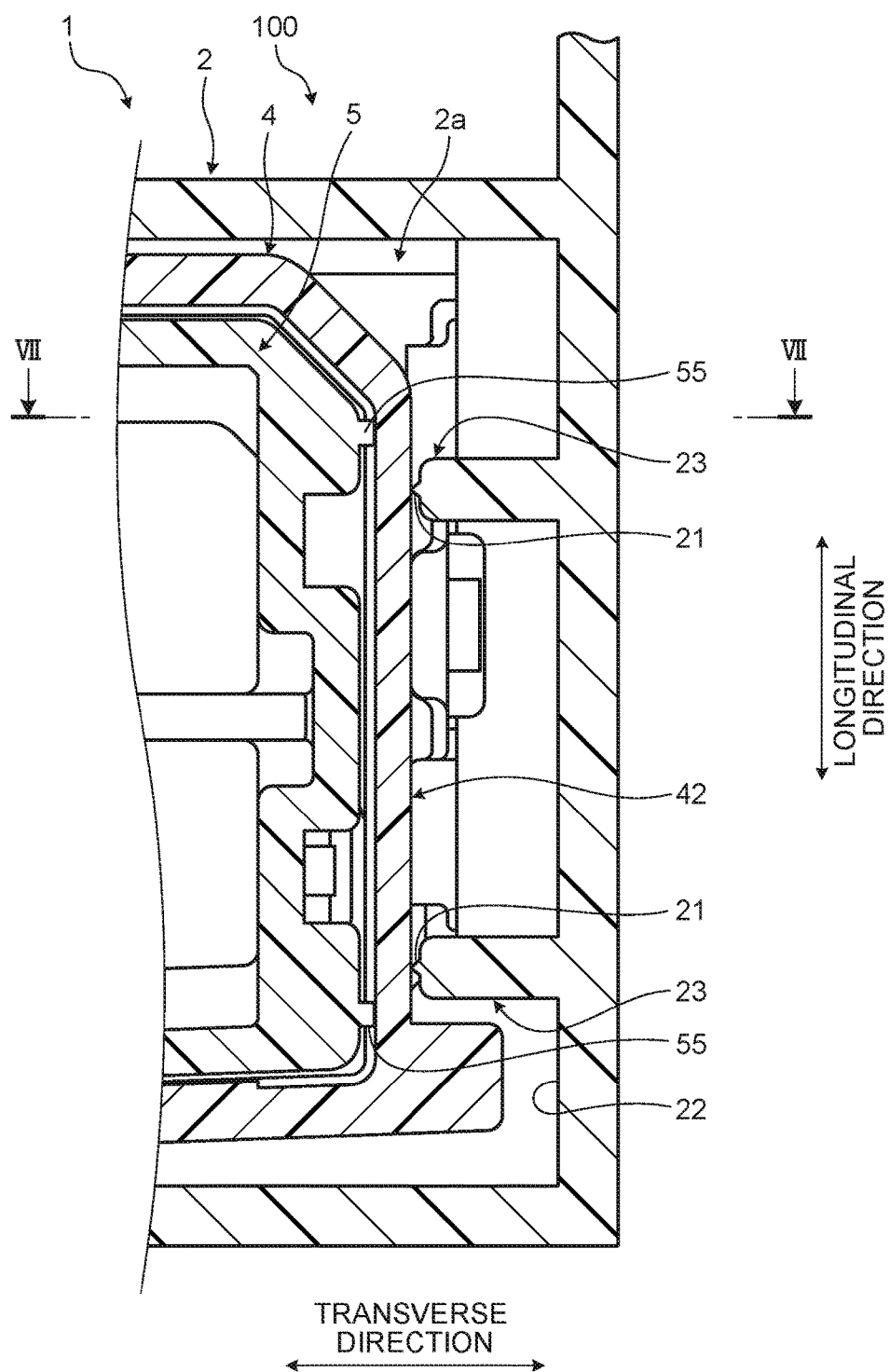
FIG. 6 is a cross-sectional view illustrating frame-side protrusions in accordance with the embodiment.
Figure 7:
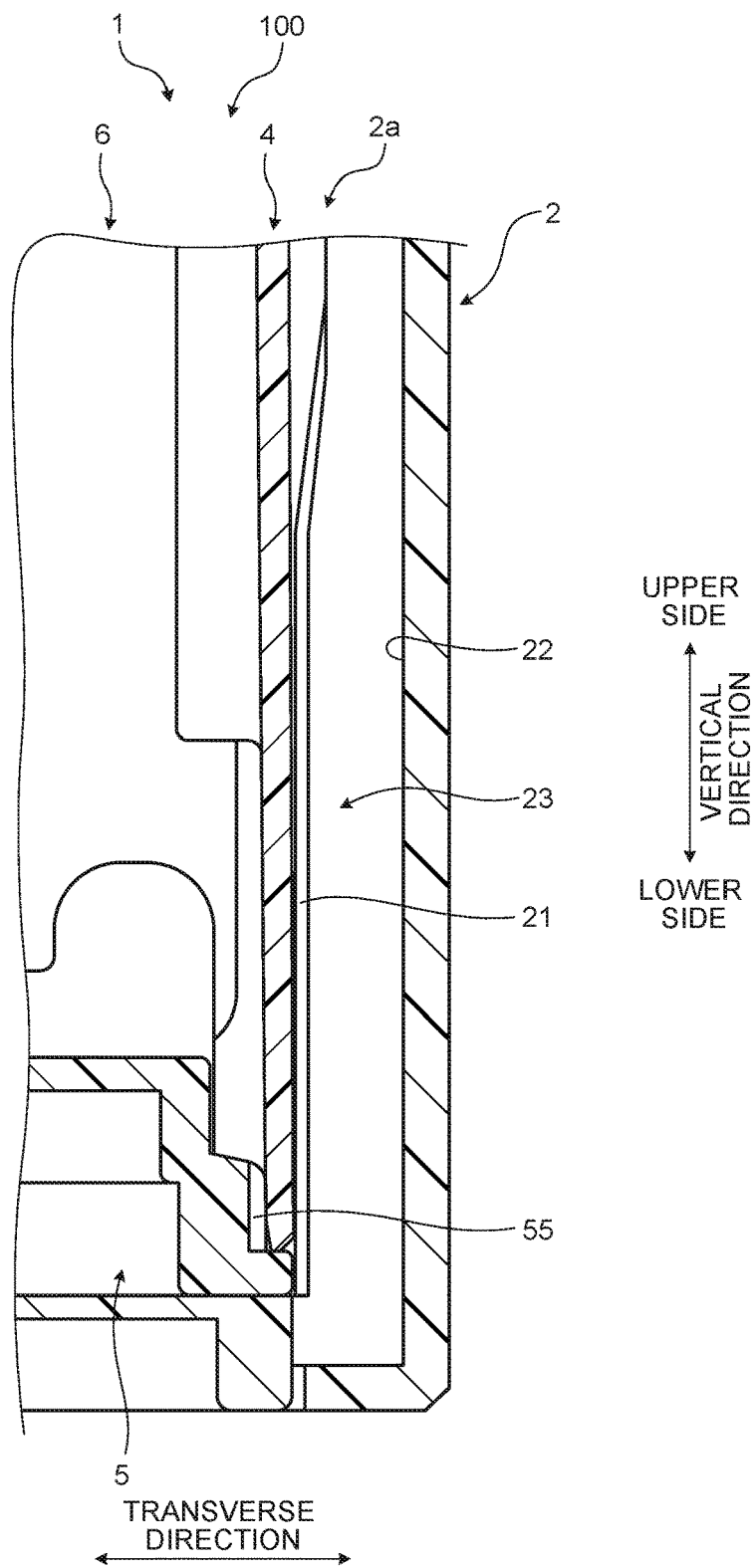
FIG. 7 is another cross-sectional view illustrating the frame-side protrusion in accordance with the embodiment.

An embodiment will be described with reference to FIGS. 1 to 7. The embodiment relates to a substrate holding structure, an electronic component module, and an electrical connection box. FIG. 1 is a perspective view illustrating an electrical connection box in accordance with the embodiment of the present invention, FIG. 2 is a bottom view illustrating the electrical connection box in accordance with the embodiment, FIG. 3 is a perspective view illustrating a substrate and a connector block in accordance with the embodiment, FIG. 4 is a cross-sectional perspective view illustrating a casing in accordance with the embodiment, FIG. 5 is a cross-sectional view illustrating an electronic component module in accordance with the embodiment, FIG. 6 is a bottom view illustrating frame-side protrusions in accordance with the embodiment, and FIG. 7 is a cross-sectional view illustrating the frame-side protrusion in accordance with the embodiment. FIG. 4 is a perspective view along IV-IV of FIG. 1, FIG. 5 is a cross-sectional view along V-V of FIG. 1, FIG. 6 is a cross-sectional view along VI-VI of FIG. 1, and FIG. 7 is a cross-sectional view along VII-VII of FIG. 6.

As illustrated in FIG. 1, an electrical connection box 1 according to the embodiment includes a frame 2 and an electronic component module 3. In the embodiment, the electrical connection box 1 is described using a case where the electrical connection box 1 is mounted on a vehicle as an example. The electrical connection box 1 forms a wire harness WH together with electric wires W. The wire harness WH is mounted on a vehicle such as an automobile, and connects respective devices mounted on the vehicle. The wire harness WH includes a plurality of the electric wires W that are used for power supply and signal communication. One ends of the electric wires W are connected to the electronic component module 3 housed in the electrical connection box 1. The other ends of the electric wires W are connected to respective devices (external devices) such as a battery and an electrical component through a connector and the like.

The electronic component module 3 of the embodiment includes a substrate holding structure 100, which will be described below, and can suppress rattling of a substrate 6 (see FIGS. 3 and 5) to a casing 4. The substrate holding structure 100 includes engagement holes 43a as holding units that hold the substrate 6 and protrusions 49 (see FIGS. 4 and 5) that are plastically deformed due to contact with the substrate 6. The protrusions 49 hold the substrate 6 inserted into the casing 4, and suppress rattling of the substrate 6 to the casing 4.

The frame 2 illustrated in FIGS. 1 and 2 holds therein the casing 4 of the electronic component module 3. The frame 2 is integrally formed by, for example, a synthetic resin. The frame 2 is a cylindrical member, and a planar shape thereof is a polygon, for example, a rectangle. The electronic component module 3 is inserted into the frame 2 from an aperture of the frame 2, or is drawn out from the frame 2. The electrical connection box 1 includes an upper cover and a lower cover, which are not illustrated, for closing the aperture of the frame 2. The frame 2 forms a closed accommodating space that accommodates the electronic component module 3 together with the upper cover and the lower cover.

The electronic component module 3 includes the casing 4 and a connector block 5. The casing 4 is an accommodating member formed in an approximately rectangular parallelepiped. The casing 4 is integrally formed by a synthetic resin or the like. The casing 4 includes an accommodating unit 7 (see FIG. 4) that accommodates the substrate 6 (see FIG. 3), which will be described later. The casing 4 includes a first side wall 41, a second side wall 42, a third side wall 43, a fourth side wall 44, and a depth wall 45. The first side wall 41, the second side wall 42, the third side wall 43, and the fourth side wall 44 form a cylindrical unit having substantially rectangular cross sections. The depth wall 45 closes one end of the cylindrical unit formed by each of the side walls 41, 42, 43, and 44. The other end of this cylindrical unit is open. In other words, the side walls 41, 42, 43, and 44, and the depth wall 45 form a square cylinder with one end open.

The electronic component module 3 according to the embodiment has an axis of the cylindrical unit formed by the side walls 41, 42, 43, and 44 extending in a vertical direction, and is mounted on a vehicle with the aperture of the casing 4 directed downward. Hereinafter, the "vertical direction" is referred to as a vehicle vertical direction when the electrical connection box 1 including the electronic component module 3 is mounted on a vehicle. A long direction of a cross-sectional shape of the casing 4 on a surface orthogonal to the vertical direction is referred to as a "transverse direction", and a short direction of the cross-sectional shape is referred to as a "longitudinal direction". The transverse direction and the longitudinal direction are orthogonal to each other.

The first side wall 41 and the second side wall 42 are opposed to each other in the transverse direction. The third side wall 43 and the fourth side wall 44 are opposed to each other in the longitudinal direction. One ends of the third side wall 43 and the fourth side wall 44 in the transverse direction are connected to the first side wall 41, and the other ends are connected to the second side wall 42. Engaging units 46 are provided to outer surfaces of the first side wall 41 and the second side wall 42. The engaging units 46 are protrusions that have substantially a U-shaped planar shape. The frame 2 has engagement protrusions corresponding to the engaging units 46. The engaging units 46 are engaged with the engagement protrusions of the frame 2 so as to connect the casing 4 and the frame 2.

A plurality of engagement holes 43a are provided to the vicinity of a lower end of the third side wall 43. The engagement holes 43a are disposed at intervals along the lower side of the third side wall 43. Three engagement holes 43a are provided to the third side wall 43 in the embodiment, and one of the engagement holes 43a and the other two engagement holes 43a are disposed at the center in the transverse direction, and on one end side and on the other end side in the transverse direction, respectively. Engagement holes 44a (see FIG. 4) the same as the engagement holes 43a are provided to the fourth side wall 44.

As illustrated in FIG. 2, the frame 2 includes module accommodating units 2a that accommodates the electronic component module 3. The frame 2 of the embodiment includes a plurality of module accommodating units 2a. The electronic component module 3 including the casing 4 is inserted into the module accommodating units 2a and is held by the frame 2.

The connector block 5 is a block-shaped member that closes the aperture of the casing 4. The connector block 5 is integrally formed by a synthetic resin or the like. A plurality of connector engaging units 52 are provided to an end surface 51 of the connector block 5. The connector engaging units 52 are frame-shaped components that protrude from the end surface 51. Each of the connector engaging units 52 includes a recess 52a with which a counterpart male connector is engaged. A plurality of terminals 53 protrude from the bottom of the recess 52a. The terminals 53 are electrically connected to terminals of the counterpart connector.

As illustrated in FIG. 3, the connector block 5 holds the substrate 6. The substrate 6 is, for example, a printed board, and wiring of an electric circuit is formed on the surface thereof. A planar shape of the substrate 6 in the embodiment is a rectangle, and corners are chamfered in an arc shape. One end side of the substrate 6 is fixed to fixtures 56 of the connector block 5 through a fastening member such as screws. The fixtures 56 sandwich the terminals 53 therebetween, and are provided at both end parts in the transverse direction. Hereinafter, a side of the substrate 6 that is fixed to the connector block 5 is referred to as a "base end side", and a free end side opposed to the side fixed to the connector block 5 is referred to as a "tip side". The substrate 6 and the connector block 5 are inserted into the casing 4 from a tip surface 6d.

The substrate 6 includes a plurality of through-holes 6a on the base end side. The through-holes 6a pass through the substrate 6 in a substrate thickness direction. The terminals 53 having conductivity are inserted through the through-holes 6a. The terminals 53 are a bar-shaped or plate-shaped member bending at a right angle, and one ends thereof are inserted through the through-holes 6a from one surface side of the substrate 6. The other ends of the terminals 53 protrude in the recesses 52a of the connector block 5 as described above. Each of the terminals 53 is electrically connected to an electric circuit of the substrate 6 by soldering. Electronic components such as a resistor 6b and a relay 6c are electrically connected to the electric circuit of the substrate 6, and the electronic components and the electric circuit of the substrate 6 form an electronic circuit as a whole.

The connector block 5 includes engagement protrusions 54. The engagement protrusions 54 are protrusions correspond to the engagement holes 43a and 44a (see FIGS. 1 and 4) of the casing 4. The engagement protrusions 54 are provided to a third side surface 5c and a fourth side surface 5d of the connector block 5. The third side surface 5c and the fourth side surface 5d are side surfaces along the long direction of the connector block 5, in other words, side surfaces extending in the transverse direction of the connector block 5, and are each directed to the longitudinal direction. The third side surface 5c is a wall surface opposed to the third side wall 43 of the casing 4. The fourth side surface 5d is a wall surface opposed to the fourth side wall 44 of the casing 4. The engagement protrusions 54 protrude in the longitudinal direction from the third side surface 5c and the fourth side surface 5d. The engagement protrusions 54 are engaged with the engagement holes 43a and 44a of the casing 4, and connect the casing 4 to the connector block 5.

Block-side protrusions 55 are provided to first side surface 5a and a second side surface 5b of the connector block 5. The block-side protrusions 55 are provided as holding-member-side protrusions. The block-side protrusions 55 contact an inner wall surface of the casing 4 and restrict relative displacement (rattling) of the connector block 5 to the casing 4. The first side surface 5a and the second side surface 5b are side surfaces along the short direction of the connector block 5, in other words, side surfaces extending in the longitudinal direction of the connector block 5, and are each directed to the transverse direction. The first side surface 5a is a wall surface opposed to the first side wall 41 of the casing 4. The second side surface 5b is a wall surface opposed to the second side wall 42 of the casing 4. The block-side protrusions 55 protrude in the transverse direction from the first side surface 5a and the second side surface 5b. The block-side protrusions 55 are linear or ridge-shaped protrusions extending along the vertical direction, in other words, the insertion direction of the substrate 6. In the connector block 5 of the embodiment, the block-side protrusions 55 are disposed one by one at one end part and the other end part of the first side surface 5a and the second side surface 5b. The block-side protrusions 55 are provided to a lower end side of the connector block 5. More specifically, the block-side protrusions 55 extend in a certain range from flanges 57 to the upper side. The flanges 57 are flange-shaped protrusions that protrude from the lower end of the third side surface 5c and the fourth side surface 5d to a direction orthogonal to the vertical direction. The flanges 57 function as stoppers that contact the edge of the casing 4 on the aperture side.

As illustrated in FIG. 4, the casing 4 includes the accommodating unit 7. The accommodating unit 7 is a space surrounded by the first side wall 41, the second side wall 42, the third side wall 43 (see FIG. 1), the fourth side wall 44, and the depth wall 45. In other words, the accommodating unit 7 is an internal space of the cylindrical casing 4 with a bottom. The first side wall 41 and the second side wall 42 each include a first guide 47, a second guide 48, and the protrusion 49. Each of the guides 47 and 48, and the protrusion 49 is provided to an inner wall surface of the first side wall 41 and the second side wall 42. The first guide 47 and the second guide 48 extend along the vertical direction, in other words, the depth direction of the accommodating unit 7. The first guide 47 and the second guide 48 are opposed to each other in the longitudinal direction. The second guide 48 disposed at a position on the fourth side wall 44 than the first guide 47, and at a certain interval to the first guide 47. The first guide 47 and the second guide 48 are protrusions that protrude from the inner wall surfaces of the side walls 41 and 42, and are integrally formed with the side walls 41 and 42.

There are grooves 8 between the first guides 47 and the second guides 48. The grooves 8 are grooves surrounded by the first guides 47, the second guides 48, and inner wall surfaces 41a and 42a of the side walls 41 and 42. The first guides 47 and the second guides 48 guide the substrate 6 inserted into the accommodating unit 7 to the grooves 8. The first guides 47 and the second guides 48 guide an end part of the substrate 6 in a width direction from both sides in the longitudinal direction so as to restrict positional displacement of the substrate 6. In this manner, the first guides 47 and the second guides 48 can prevent contact with electronic components connected to the substrate 6 and the inner wall surfaces of the casing 4. A groove width of the grooves 8 is expanded toward an entrance side so that the substrate 6 is smoothly guided to the grooves 8 at the entrance part.

The protrusions 49 are protrusions that protrude from the inner wall surfaces 41a and 42a of the first side wall 41 and the second side wall 42, and are integrally formed with the side walls 41 and 42. Hereinafter, the inner wall surfaces 41a and 42a are also referred to as "side wall surfaces 41a and 42a". The side wall surfaces 41a and 42a are wall surfaces along the insertion direction of the substrate 6 in the accommodating unit 7. In addition, the side wall surfaces 41a and 42a are wall surfaces opposed to side surfaces 6e and 6f (see FIG. 3) of the substrate 6 inserted into the accommodating unit 7. The protrusion 49 of the first side wall 41 and the protrusion 49 of the second side wall 42 are opposed to each other in the transverse direction. In other words, the protrusion 49 of the first side wall 41 and the protrusion 49 of the second side wall 42 have the position in the longitudinal direction and the position in the vertical direction in common.

A shape of each of the protrusions 49 is a tapered shape in which a width in the vertical direction is narrowed toward the tip side in the protrusion direction. The shape of the protrusions 49 in the embodiment is a triangular pyramid shape, and extends in the longitudinal direction. In other words, in the protrusions 49, a cross section orthogonal to the longitudinal direction is a triangle. Both ends of each protrusion 49 are connected to the first guide 47 and the second guide 48, respectively. An interval between the tip of the protrusion 49 on the first side wall 41 and the tip of the protrusion 49 on the second side wall 42 is narrower than a width W1 (see FIG. 3) of the substrate 6. The interval between the tips of the protrusions 49 is defined so that at least one of the side surfaces 6e and 6f of the substrate 6 contacts the protrusions 49 at the time of inserting the substrate 6 into the accommodating unit 7. In the embodiment, even when warping and twisting within a range assumed on design occurs on the substrate 6, the interval between the pair of opposed protrusions 49 is defined so that the side surfaces 6e and 6f each contact the protrusions 49. The protrusions 49 are crush ribs that are plastically deformed due to contact with the substrate 6 inserted into the accommodating unit 7.

The substrate 6 is inserted from an aperture 4a to the depth wall 45 of the casing 4. More specifically, the connector block 5 and the substrate 6 are inserted into the accommodating unit 7 from the aperture 4a to the depth wall 45 with the tip surface 6d first. The accommodating unit 7 of the casing 4 accommodates therein the inserted substrate 6, and accommodates at least a part of the connector block 5. The connector block 5 inserted into the accommodating unit 7 closes the aperture 4a of the casing 4, and forms a closed space for accommodating the substrate 6 in the casing 4.

When the connector block 5 is inserted into the accommodating unit 7, the engagement protrusions 54 of the connector block 5 enter the engagement holes 43a and 44a from the inside of the casing 4, and are engaged with the engagement holes 43a and 44a as illustrated in FIG. 1. The engagement protrusions 54 engaged with the engagement holes 43a and 44a restrict the connector block 5 not to be pulled out of the accommodating unit 7.

When the substrate 6 to be inserted into the accommodating unit 7 contacts the protrusions 49, contact parts of the protrusions 49 with the substrate 6 are plastically deformed. The substrate 6 deforms the protrusions 49, and is inserted into a deep part of the accommodating unit 7 while sliding with the protrusions 49. While a part of the protrusions 49 on the tip side is plastically deformed, the protrusions 49 are elastically deformed as a whole depending on pressing force received from the substrate 6. A material (strength), a shape, size, and the like of the protrusions 49 are defined so that at least a part of the protrusions 49 on the tip side is plastically deformed and crushed due to contact with the substrate 6. A material (modulus of elasticity), a shape, size, and the like of the protrusions 49 are preferably defined so that at least a part of the protrusions 49 on the base end side is plastically deformed so as to keep a contact state between the protrusions 49 and the substrate 6. When insertion of the substrate 6 into the accommodating unit 7 is completed, grooves for sandwiching the substrate 6 from both sides in the longitudinal direction are formed on the protrusions 49 by plastic deformation. The grooves of the protrusions 49 preferably contact and hold the substrate 6, but there may be a gap between the grooves and the substrate 6.

The protrusions 49 suppress relative displacement of the substrate 6 to the casing 4. As illustrated in FIG. 5, the pair of protrusions 49 opposed to each other in the transverse direction suppress relative displacement of the substrate 6 to the casing 4 in the transverse direction. The protrusion 49 on the first side wall 41 narrows a movable range of the substrate 6 toward the inner wall surface 41a. By contrast, the protrusion 49 on the second side wall 42 narrows a movable range of the substrate 6 toward the inner wall surface 42a. In this manner, the pair of protrusion 49 restrict relative displacement of the substrate 6 to the casing 4 in the transverse direction.

The grooves formed on the protrusions 49 due to plastic deformation sandwich the substrate 6 from both sides in the longitudinal direction, and restrict relative displacement of the substrate 6 to the casing 4 in the longitudinal direction. Thus, the protrusions 49 in the embodiment suppress the casing 4 and the substrate 6 from moving differently from each other upon vibration of a vehicle, in other words, suppress vibration from occurring on the casing 4 and the substrate 6 in an independent and different manner from each other. When the protrusions 49 are not provided to the casing 4, it is assumed that the casing 4 and the substrate 6 vibrate differently from each other, and electronic components and a soldering unit of the substrate 6 are easily affected by the vibration. By contrast, in the electronic component module 3 of the embodiment, the protrusions 49 suppress different vibration of the casing 4 and the substrate 6. The casing 4 not only holds the end part of the substrate 6 on the insertion direction-entrance side through the connector block 5, but also holds a part of the substrate 6 on the tip side than the connector block 5 with the protrusions 49. In this manner, rattling of the casing 4 and the substrate 6 is suppressed, and the electronic components and the soldering unit of the substrate 6 are suitably protected.

The protrusions 49 of the embodiment are disposed in a deep part of the side wall surfaces 41a and 42a in the insertion direction of the substrate 6. As illustrated in FIGS. 4 and 5, the protrusions 49 are disposed at the end part of the grooves 8 on the upper side. More specifically, the protrusions 49 are disposed on the slightly lower sides (base end sides) than chamfered portions 6g and 6h of the substrate 6 accommodated in the accommodating unit 7. The chamfered portion 6g is a chamfered portion at an angle made by intersection of the tip surface 6d and the side surface 6e on the first side wall 41 side. The chamfered portion 6h is a chamfered portion at an angle made by intersection of the tip surface 6d and the side surface 6f on the second side wall 42 side. The protrusions 49 are provided so that the tips of the protrusions 49 are disposed slightly lower than the chamfered portions 6g and 6h when the casing 4 and the connector block 5 are engaged with each other. The protrusions 49 disposed at a deep part in the insertion direction hold the tip part of the substrate 6. As described above, the end part of the substrate 6 on the entrance side (base end side) in the insertion direction is held by the casing 4 through the connector block 5. Thus, in the electronic component module 3 of the embodiment, both end parts of the substrate 6 in the insertion direction are held by the casing 4. In this manner, the electronic component module 3 of the embodiment suitably suppresses rattling of the substrate 6 to the casing 4.

When the connector block 5 is inserted into the accommodating unit 7, as illustrated in FIG. 5, the block-side protrusions 55 of the connector block 5 contact the inner wall surfaces of the casing 4. The block-side protrusion 55 on the first side surface 5a contacts the inner wall surface 41a on the first side wall 41 of the casing 4, and the block-side protrusion 55 on the second side surface 5b contacts the inner wall surface 42a on the second side wall 42 of the casing 4. The connector block 5 is inserted toward a depth side of the accommodating unit 7 while the block-side protrusion 55 on the first side surface 5a slides with the first side wall 41 and the block-side protrusion 55 on the second side surface 5b slides with the second side wall 42. The engagement protrusions 54 of the connector block 5 are engaged with the engagement holes 43a and 44a when the block-side protrusion 55 on the first side surface 5a presses the first side wall 41 and the block-side protrusion 55 on the second side surface 5b presses the second side wall 42. Thus, the block-side protrusions 55 restrict the connector block 5 to relatively move against the casing 4 in the transverse direction and the longitudinal direction, and suppress rattling of the casing 4 and the connector block 5.

As described with reference to FIGS. 6 and 7, the frame 2 of the embodiment includes frame-side protrusions 21 that suppress relative displacement of the casing 4 to the frame 2. The frame-side protrusions 21 are provided to the wall surfaces of the frame 2 opposed to the casing 4. The frame-side protrusions 21 of the embodiment are provided to the wall surfaces of the frame 2 opposed to the first side wall 41 and the second side wall 42 of the casing 4. In other words, the frame-side protrusions 21 are provided to the wall surfaces opposed to each other sandwiching the casing 4 in the transverse direction. FIGS. 6 and 7 illustrate a wall surface 22 of the frame 2 opposed to the second side wall 42 and the frame-side protrusions 21 provided to the wall surface 22. The frame-side protrusions 21 that are provided to the wall surface opposed to the first side wall 41 are the same as the frame-side protrusions 21 that are provided to the wall surface 22.

The frame-side protrusions 21 protrude from the wall surface 22 toward the inside of the module accommodating unit 2a. In the frame 2 of the embodiment, as illustrated in FIG. 6, a pair of ribs 23 protrude from the wall surface 22. The ribs 23 are protrusions having a rectangular cross section, and extend in the vertical direction. Engagement protrusions or the like engaged with the engaging units 46 (see FIG. 1) of the casing 4 are provided between the pair of ribs 23. The frame-side protrusions 21 are provided to the tip surfaces of the ribs 23. As illustrated in FIG. 7, the frame-side protrusion 21 is provided in a certain range from the lower end part of the module accommodating unit 2a toward upward. A cross section of the frame-side protrusions 21 is a tapered shape in which a width in the longitudinal direction is narrowed toward the tip side in the protrusion direction.

The frame-side protrusions 21 are crush ribs that contact the casing 4 inserted into the module accommodating unit 2a so as to be plastically deformed. When the casing 4 inserted into the module accommodating unit 2a contacts the frame-side protrusions 21, contact parts of the frame-side protrusions 21 with the casing 4 are plastically deformed. The casing 4 is, for example, inserted into the module accommodating unit 2a from below with the depth wall 45 directed upward. The outer wall surfaces of the first side wall 41 and the second side wall 42 of the casing 4 have a part of the rear end side (aperture 4a side) in the insertion direction overhanging laterally than a part of the tip side (depth wall 45 side). In other words, on the outer wall surfaces of the casing 4, a part opposed to the frame-side protrusion 21 at the time of inserting the casing 4 into the module accommodating unit 2a has the rear end side extending in the transverse direction than the tip side in the insertion direction. The tip part of the casing 4 can be inserted into the module accommodating unit 2a without contacting the frame-side protrusions 21. By contrast, the rear end part of the casing 4 contacts and plastically deforms the frame-side protrusions 21. The casing 4 plastically deforms the frame-side protrusions 21, and is inserted into the module accommodating unit 2a until the engagement protrusions of the frame 2 are engaged with the engaging units 46. When accommodated in the module accommodating unit 2a, the casing 4 is held by the frame-side protrusions 21. The frame-side protrusions 21 restrict relative displacement of the casing 4 to the frame 2 in the transverse direction. In addition, the frame-side protrusions 21 can restrict relative displacement of the casing 4 to the frame 2 in the longitudinal direction.

In this manner, in the electrical connection box 1 of the embodiment, the first side wall 41 and the second side wall 42 of the casing 4 are held from both surface sides by the block-side protrusions 55 and the frame-side protrusions 21. In this manner, rattling of the casing 4 and the substrate 6 to the frame 2 and the rattling of the substrate 6 to the casing 4 are suppressed. Thus, the electrical connection box 1 of the embodiment can alleviate influences of vibration of the substrate 6 to the electronic components and the soldering unit. In the embodiment, as illustrated in FIG. 6, the block-side protrusions 55 and the frame-side protrusions 21 are opposed to each other in the transverse direction sandwiching the side walls 41 and 42 so as to suitably suppress rattling of the casing 4. Positions of the block-side protrusions 55 and the frame-side protrusions 21 in the longitudinal direction preferably coincide with each other, however, the positions in the longitudinal direction may be slightly misaligned as the embodiment.

As described above, the electronic component module 3 according to the embodiment includes the substrate holding structure 100 holding the substrate 6. The substrate holding structure 100 includes the engagement holes 43a and 44a, and the protrusions 49. The engagement holes 43a and 44a are provided to the casing 4, and function as the holding units that hold the end part of the substrate 6 accommodated in the accommodating unit 7 on the insertion direction-entrance side. The engagement holes 43a and 44a are engaged with the engagement protrusions 54 so as to restrict relative displacement of the connector block 5 to the casing 4 in the transverse direction and the longitudinal direction. In other words, the engagement holes 43a and 44a hold the end part of the substrate 6 on the entrance side through the connector block 5. The holding units may be assumed to include the connector block 5 in addition to the engagement holes 43a and 44a. The connector block 5 can function as the holding unit together with the casing 4 because the connector block 5 is connected to or combined with the casing 4 and holds the end part of the substrate 6 on the insertion direction-entrance side.

The protrusions 49 protrude from the side wall surfaces 41a and 42a. The side wall surfaces 41a and 42a are wall surfaces along the insertion direction of the substrate 6 in the accommodating unit 7, and are wall surfaces opposed to the side surfaces 6e and 6f of the substrate 6. The protrusions 49 are plastically deformed due to contact with the substrate 6 inserted into the accommodating unit 7. The end part of the substrate 6 on the entrance side in the insertion direction is held by not only the engagement holes 43a and 44a through the connector block 5 but also the protrusions 49 at a position on the tip side than the connector block 5. The protrusions 49 can suppress rattling of the substrate 6 to the casing 4 compared to a casing where the substrate 6 is held in a cantilevered state by the connector block 5.

Even when deformation such as bending and twisting occurs on the substrate 6, the protrusions 49 can deform the substrate 6 and hold the deformed substrate 6 without correcting the deformation. The protrusions 49 are plastically deformed due to contact with the substrate 6, but do not give a large force to the substrate 6 in a direction where the deformation is restored. In this manner, the protrusions 49 can hold the substrate 6 while suppressing new stress from being applied to a soldered part. The protrusions 49 are plastically deformed due to contact with the substrate 6 so as to hold the substrate 6 without generating excessive stress on the casing 4 and the substrate 6.

The protrusions 49 are provided to both of the pair of side wall surfaces 41a and 42a that are opposed to each other sandwiching the substrate 6. The pair of protrusions 49 can hold the substrate 6 from both sides in the width direction, and suitably suppress rattling of the boar 6 to the casing 4.

The protrusions 49 are disposed in the deep part of the side wall surfaces 41a and 42a in the insertion direction of the substrate 6. Thus, both end parts of the substrate 6 in the insertion direction are held by the casing 4. In this manner, rattling of the substrate 6 to the casing 4 is suitably suppressed.

The substrate holding structure 100 of the embodiment includes the block-side protrusions 55 provided to the connector block 5. The connector block 5 is connected to the end part of the substrate 6 on the insertion direction-entrance side, and is a holding member held by the engagement holes 43a and 44a as the holding units. The block-side protrusions 55 contact the inner wall surfaces of the casing 4, and press the casing 4 so as to suppress relative displacement of the connector block 5 and the substrate 6 to the casing 4. In this manner, rattling of the substrate 6 to the casing 4 is suitably suppressed.

The electronic component module 3 according to the embodiment includes the substrate 6 to which the electronic components are connected, the casing 4 including the accommodating unit 7, the engagement holes 43a and 44a as the holding units, the substrate 6 inserted into the accommodating unit 7, and the protrusions 49. The electronic component module 3 of the embodiment can suitably suppress rattling of the substrate 6 to the casing 4.

The electrical connection box 1 according to the embodiment includes the substrate 6 to which the electronic components are connected, the casing 4 including the accommodating unit 7, the engagement holes 43a and 44a as the holding units, the protrusions 49, and the frame 2 holding therein the casing 4. The electrical connection box 1 of the embodiment can suitably suppress rattling of the substrate 6 to the casing 4.

Modification

Positions and shapes of the protrusions 49, the block-side protrusions 55, and the frame-side protrusions 21 are not limited to the exemplified ones. For example, the position of the protrusions 49 is not limited to the illustrated one. The position of the protrusions 49 is preferably the deep part on the inner wall surfaces 41a and 42a in the insertion direction of the substrate 6, however, this deep part is not limited to the illustrated position which is slightly on the base end side than the chamfered portions 6g and 6h of the substrate 6. The "deep part" may be, for example, a range R1 (see FIG. 5) on the tip side than an intermediate position of the insertion direction of the substrate 6. The "deep part" may be a range R2 (see FIG. 5) having one third the length from the tip surface 6d of the substrate 6. The "deep part" may be a range having one fourth, one fifth, one tenth, and the like the length from the tip surface 6d of the substrate 6. The position of the protrusions 49 is preferably defined so that the vibration frequency of main vibration occurring in a vehicle and the natural vibration frequency of the substrate 6 held by the protrusions 49 do not coincide with each other.

Corners of the substrate 6 are not necessarily chamfered. In this case, the protrusions 49 are preferably disposed slightly on the base end side than the corners of the substrate 6 at the insertion direction tip. The grooves 8 are not necessarily provided to the side wall surfaces 41a and 42a. In this case, an installed range (range in the longitudinal direction) of the protrusions 49 on the inner wall surfaces 41a and 42a is, for example, a range assumed as a passage range of the substrate 6.

A plurality of protrusions 49 may be disposed on the side wall surfaces 41a and 42a along the insertion direction. For example, another protrusion 49 may be provided between the position of the illustrated protrusions 49 and the connector block 5. The protrusions 49 may be provided to only one of the side wall surfaces 41a and 42a. In other words, the protrusions 49 may be provided to a position where one of the side surfaces 6e and 6f of the substrate 6 is held. For example, in the casing 4, when the inner wall surface 41a opposed to one side surface 6e is present in the vicinity of the side surface 6e and the inner wall surface 42a opposed to the other side surface 6f is located at a position distant from the side surface 6f, the protrusions 49 may be provided to only the inner wall surface 41a.

The protrusions 49 may be provided to not only the first side wall 41 and the second side wall 42 but also the depth wall 45. In this case, the protrusions 49 are protrusions that protrude from the inner wall surface of the depth wall 45 toward the entrance side of the accommodating unit 7. The protrusion amount of the protrusions 49 on the depth wall 45 is defined so that the protrusions 49 contact the tip surface 6d of the substrate 6 inserted into the accommodating unit 7.

The connector block 5 may be pressed into the casing 4, and be held by the casing 4 at the engagement part with the casing 4. In this case, the engagement unit of the casing 4 with the connector block 5 functions as the holding unit. In the casing 4, the depth side of the accommodating unit 7 is not necessarily closed. The casing 4 may be a cylindrical casing where the depth wall 45 is absent and both ends are open.

Contents disclosed in the embodiment and the modification can be combined as appropriate so as to be implemented.

A substrate holding structure, an electronic component module and an electrical connection box according to the embodiment include holding units that are provided to a casing and hold an end part of a substrate accommodated in an accommodating unit on an insertion direction-entrance side of the substrate; and protrusions that protrude from side wall surfaces that are wall surfaces of the casing along the insertion direction of the substrate and wall surfaces opposed to side surfaces of the substrate, and are plastically deformed due to contact with the substrate to be inserted into the accommodating unit. The substrate holding structure, the electronic component module and the electrical connection box according to the present invention can suppress relative displacement of the substrate to the casing with protrusions, and suppress rattling of the substrate.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A substrate holding structure comprising:
a holding unit that is provided to a casing including an accommodating unit that accommodates therein an inserted substrate, and holds an end part of the substrate accommodated in the accommodating unit on an insertion direction-entrance side of the substrate; and
protrusions that protrude from side wall surfaces that are wall surfaces of the casing along an insertion direction of the substrate and opposed to side surfaces of the substrate, and that are plastically deformed due to contact with the substrate in a width direction of the substrate when the substrate is inserted into the accommodating unit.

2. The substrate holding structure according to claim 1, wherein
the protrusions are provided to both of the pair of side wall surfaces that are opposed to each other and sandwiching the substrate.

3. The substrate holding structure according to claim 1, wherein
the protrusions are disposed in a deep part on the side wall surfaces in the insertion direction of the substrate.

4. The substrate holding structure according to claim 2, wherein
the protrusions are disposed in a deep part on the side wall surfaces in the insertion direction of the substrate.

5. The substrate holding structure according to claim 1, further comprising:
a holding member that is connected to the end part of the substrate on the insertion direction-entrance side of the substrate, and is held by the holding unit, wherein
the holding member includes holding-member-side protrusions that come into contact with an inner wall surface of the casing in a state where the holding member is held by the holding unit.

6. The substrate holding structure according to claim 2, further comprising:
a holding member that is connected to the end part of the substrate on the insertion direction-entrance side of the substrate, and is held by the holding unit, wherein
the holding member includes holding-member-side protrusions that come into contact with an inner wall surface of the casing in a state where the holding member is held by the holding unit.

7. The substrate holding structure according to claim 3, further comprising:
a holding member that is connected to the end part of the substrate on the insertion direction-entrance side of the substrate, and is held by the holding unit, wherein
the holding member includes holding-member-side protrusions that come into contact with an inner wall surface of the casing in a state where the holding member is held by the holding unit.

8. An electronic component module comprising:
a substrate to which an electronic component is connected;
a casing that includes an accommodating unit, the substrate is inserted into and accommodated in the accommodating unit;
a holding unit that is provided to the casing, and holds an end part of the substrate accommodated in the accommodating unit on an insertion direction-entrance side of the substrate; and
protrusions that protrude from side wall surfaces that are wall surfaces of the casing along an insertion direction of the substrate and opposed to side surfaces of the substrate, and that are plastically deformed due to contact with the substrate in a width direction of the substrate when the substrate is inserted into the accommodating unit.

9. An electrical connection box comprising:
a substrate to which an electronic component is connected;
a casing that includes an accommodating unit, the substrate is inserted into and accommodated in the accommodating unit;
a holding unit that is provided to the casing, and holds an end part of the substrate accommodated in the accommodating unit on an insertion direction-entrance side of the substrate;
protrusions that protrude from side wall surfaces that are wall surfaces of the casing along an insertion direction of the substrate and opposed to side surfaces of the substrate, and that are plastically deformed due to contact with the substrate in a width direction of the substrate when the substrate is inserted into the accommodating unit; and
a frame that holds therein the casing.

10. The substrate holding structure according to claim 1, wherein
the substrate plastically deforms the protrusions to include a respective groove that sandwiches the substrate from both sides.

11. The substrate holding structure according to claim 1, wherein
the substrate elastically deforms a portion of each of the protrusions, and
each of the protrusions includes a tip portion that the substrate plastically deforms.

12. The substrate holding structure according to claim 1, wherein
the protrusions are provided to both of the pair of side wall surfaces that are opposed to each other and sandwiching the substrate, and
an interval between a tip of the protrusion on one of the pair of side wall surfaces and a tip of the protrusion on the other of the pair of side walls is narrower than a width of the substrate.

* * * * *